US010381602B2

(12) United States Patent
Han

(10) Patent No.: US 10,381,602 B2
(45) Date of Patent: Aug. 13, 2019

(54) DEPOSITION APPARATUS AND METHOD OF MANUFACTURING ORGANIC LIGHT-EMITTING DIODE DISPLAY APPARATUS USING THE SAME

(71) Applicant: Samsung Display Co., Ltd., Yongin-si (KR)

(72) Inventor: Jeongwon Han, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 129 days.

(21) Appl. No.: 15/197,718

(22) Filed: Jun. 29, 2016

(65) Prior Publication Data

US 2017/0104184 A1 Apr. 13, 2017

(30) Foreign Application Priority Data

Oct. 12, 2015 (KR) ........................ 10-2015-0142161

(51) Int. Cl.

| | |
|---|---|
| ***C22C 16/00*** | (2006.01) |
| ***H01L 51/56*** | (2006.01) |
| ***H01L 51/00*** | (2006.01) |
| ***C23C 14/04*** | (2006.01) |
| ***C23C 14/54*** | (2006.01) |

(52) U.S. Cl.

CPC ............ *H01L 51/56* (2013.01); *C23C 14/042* (2013.01); *C23C 14/54* (2013.01); *H01L 51/0011* (2013.01)

(58) Field of Classification Search

CPC .......................... C23C 14/042; H01L 51/0011
See application file for complete search history.

(56) References Cited

U.S. PATENT DOCUMENTS 3,276,423 A * 10/1966 Triller ..................... H01L 49/02 118/504
3,625,598 A * 12/1971 Brown ...................... G02F 1/31 359/861
4,096,821 A * 6/1978 Greeneich ............ C23C 14/042 118/301
5,507,870 A * 4/1996 Siebert .................. C23C 14/548 118/664
6,021,151 A * 2/2000 Eguchi .................... H01S 3/005 372/61

(Continued)

FOREIGN PATENT DOCUMENTS

JP 2004-063234 2/2004
JP 2014-101539 6/2014

(Continued)

*Primary Examiner* — Keath T Chen
(74) *Attorney, Agent, or Firm* — H.C. Park & Associates, PLC

(57) ABSTRACT

A deposition apparatus includes a chamber, a stage, a mask, a chuck, a deposition source, a laser generator, and an optical assembly. The stage is supported in the chamber. The mask is disposed on the stage. The mask includes a deposition pattern. The chuck is configured to support a substrate in the chamber. The chuck is configured to position the substrate to overlap the deposition pattern. The deposition source is disposed in the chamber. The deposition source is configured to provide a deposition material toward the substrate. The laser generator is configured to generate a laser beam. The optical assembly is configured to guide the laser beam between the mask and the substrate.

20 Claims, 10 Drawing Sheets

(56) References Cited

U.S. PATENT DOCUMENTS

| | | | | |
|---|---|---|---|---|
| 2002/0062785 | A1* | 5/2002 | Kim | C23C 14/042 118/504 |
| 2006/0030164 | A1 | 2/2006 | Im | |
| 2007/0190235 | A1* | 8/2007 | Yamazaki | C23C 14/24 427/64 |
| 2012/0285379 | A1 | 11/2012 | Hirakata et al. | |
| 2012/0329188 | A1* | 12/2012 | Sonoda | C23C 14/042 438/34 |
| 2013/0252848 | A1* | 9/2013 | Okano | G01N 33/566 506/10 |
| 2014/0014929 | A1 | 1/2014 | Lee et al. | |
| 2014/0178605 | A1* | 6/2014 | Kim | C23C 14/042 427/596 |

FOREIGN PATENT DOCUMENTS

| | | |
|---|---|---|
| JP | 2015-092504 | 5/2015 |
| KR | 10-2005-0035561 | 4/2005 |
| KR | 10-2005-0048617 | 5/2005 |
| KR | 10-2014-0044110 | 4/2014 |

* cited by examiner

DEPOSITION APPARATUS AND METHOD OF MANUFACTURING ORGANIC LIGHT-EMITTING DIODE DISPLAY APPARATUS USING THE SAME

CROSS-REFERENCE TO RELATED APPLICATION

This application claims priority from and the benefit of Korean Patent Application No. 10-2015-0142161, filed on Oct. 12, 2015, which is hereby incorporated by reference for all purposes as if fully set forth herein.

BACKGROUND

Field

One or more exemplary embodiments relate to an apparatus and a method, and, more particularly, to a deposition apparatus and a method of manufacturing an organic light-emitting diode (OLED) display apparatus using the same.

Discussion

Mobile electronic devices based on mobility have come into widespread use. Recently, in addition to small electronic devices such as mobile phones, tablet personal computers (PCs) are widely used as mobile electronic apparatuses.

Mobile electronic devices, such as mobile phones, notebook computers, personal digital assistants, tablets, etc., are widely used. These devices typically include a display unit to provide users with visual information, such as an image or video information, in order to support various functions. Components for driving display units have become smaller, but the display units themselves have become more important in conventional mobile electronic devices. It is also noted that a flexible structure in which a display unit may be bent from a first (e.g., flat) state to a second (e.g., bent at a certain angle) state are of interest.

A conventional organic light-emitting diode (OLED) display apparatus may be manufactured using a vacuum deposition process performed by depositing an organic material or a metal material that may be used as an electrode on a substrate in a vacuum environment to form a thin film on the substrate. The vacuum deposition process may be performed by locating a substrate upon which an organic thin film is to be formed in a vacuum chamber, adhering a fine metal mask (FMM) to the substrate, and depositing an organic material on the substrate by evaporating or sublimating the organic material using a deposition source. The FMM typically has the same (or a similar) pattern as a pattern to be formed as the organic thin film.

The above information disclosed in this Background section is only for enhancement of understanding of the background of the inventive concept, and, therefore, it may contain information that does not form the prior art that is already known to a person of ordinary skill in the art.

SUMMARY

One or more exemplary embodiments include a deposition apparatus for precisely depositing a deposition material on a substrate using a laser beam, and a method of manufacturing an organic light-emitting diode (OLED) display apparatus using the same.

Additional aspects will be set forth in the detailed description which follows, and, in part, will be apparent from the disclosure, or may be learned by practice of the inventive concept.

According to one or more exemplary embodiments, a deposition apparatus includes a chamber, a stage, a mask, a chuck, a deposition source, a laser generator, and an optical assembly. The stage is supported in the chamber. The mask is disposed on the stage. The mask includes a deposition pattern. The chuck is configured to support a substrate in the chamber. The chuck is configured to position the substrate to overlap the deposition pattern. The deposition source is disposed in the chamber. The deposition source is configured to provide a deposition material toward the substrate. The laser generator is configured to generate a laser beam. The optical assembly is configured to guide the laser beam between the mask and the substrate.

According to one or more exemplary embodiments, a method of manufacturing an organic light-emitting diode (OLED) display includes: causing, at least in part, a substrate to be u) positioned over a mask in a deposition chamber via a chuck configured to translate in the deposition chamber; causing, at least in part, laser light to propagate between the mask and the substrate; and causing, at least in part, a deposition material to be provided from a deposition source disposed in the deposition chamber. The deposition material passes through the mask and is deposited on the substrate according to a pattern of the mask and a pattern of the laser light.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
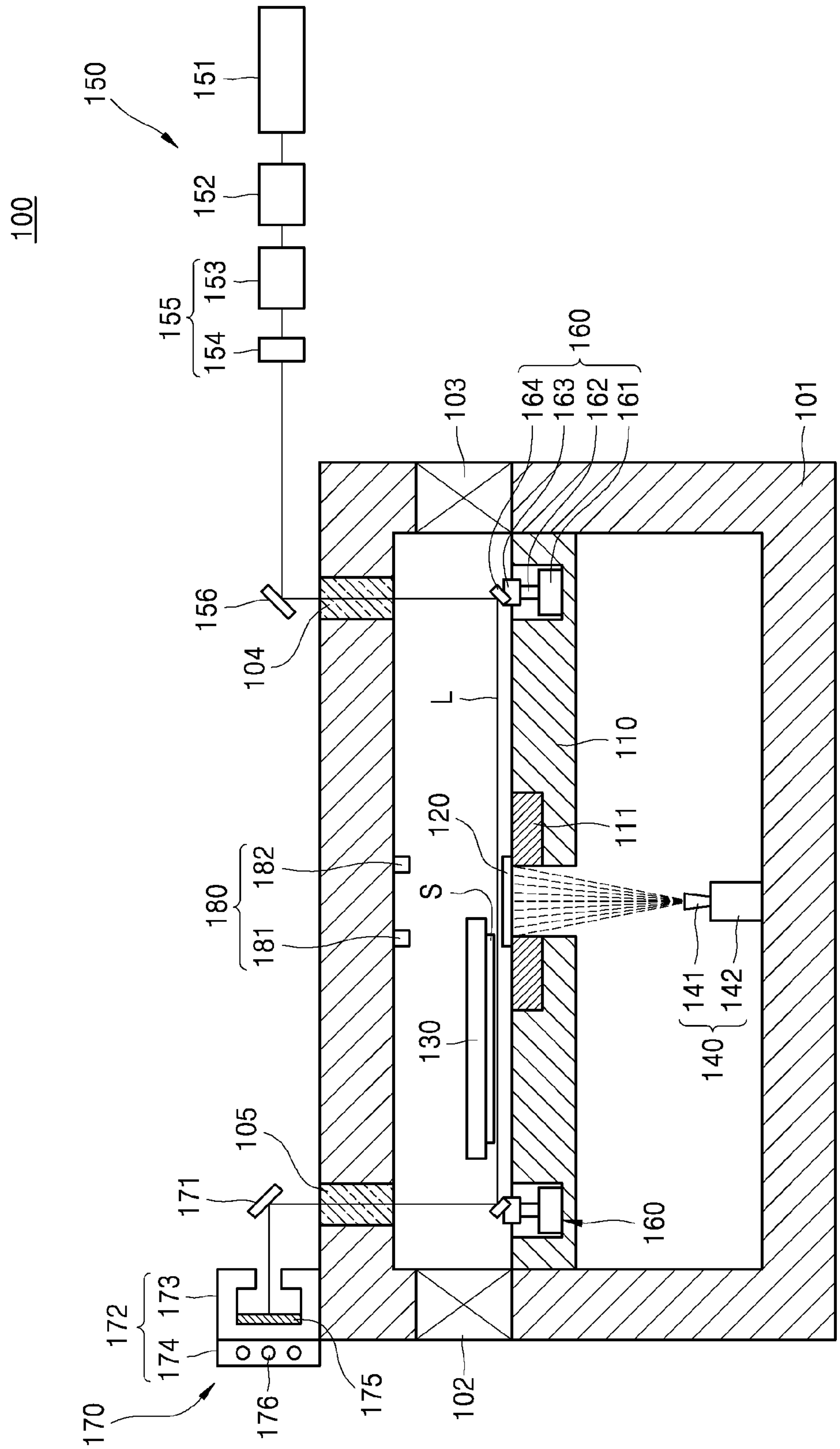
FIG. 1 is a conceptual diagram of a cross-sectional view of a deposition apparatus, according to one or more exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

Unless otherwise specified, the illustrated exemplary embodiments are to be understood as providing exemplary features of varying detail of various exemplary embodiments. Therefore, unless otherwise specified, the features, components, modules, layers, films, panels, regions, and/or aspects of the various illustrations may be otherwise combined, separated, interchanged, and/or rearranged without departing from the disclosed exemplary embodiments. Further, in the accompanying figures, the size and relative sizes of layers, films, panels, regions, etc., may be exaggerated for clarity and descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. Further, the x-axis, the y-axis, and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms "first," "second," etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Although various exemplary embodiments are described with respect to manufacturing an organic light emitting display (OLED) apparatus, it is contemplated that various exemplary embodiments are also applicable to fabricating similar articles of manufacture, such as, for example, display devices, semiconductor devices, and the like.

Figure 2:
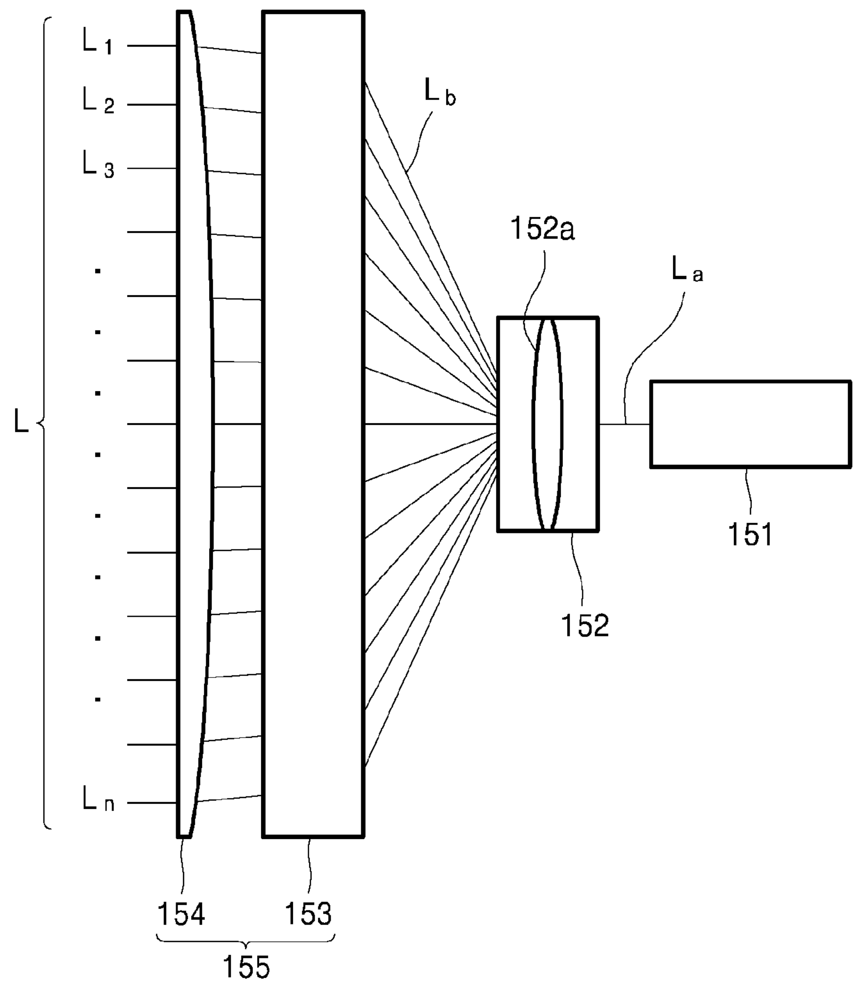
FIG. 2 is a conceptual view of a laser generation unit of the deposition apparatus of FIG. 1, according to one or more exemplary embodiments.

FIG. 1 is a conceptual diagram of a cross-sectional view of a deposition apparatus, according to one or more exemplary embodiments. FIG. 2 is a conceptual view of a laser generation unit of the deposition apparatus of FIG. 1, according to one or more exemplary embodiments.

Referring to FIGS. 1 and 2, a deposition apparatus 100 includes a chamber 101 configured to provide a pressurized space (e.g., a vacuum environment) separate from an external (e.g., ambient) environment. The chamber 101 may be held under condition(s) to ensure linearity of a deposition material, such as by maintaining a certain degree of vacuum. An entrance 102 (e.g., a first gate valve) into which a substrate S is transported inside the chamber 101 may be installed in a side wall of the chamber 101, and an exit 103 (e.g., a second gate valve) from which the substrate S may be transported outside the chamber 101 may be installed on another side wall of the chamber 101. A location of the entrance 102 and/or the exit 103 is not limited to a particular location, and a size of the entrance 102 and/or the exit 103 is not limited to a particular size. It is also contemplated that the entrance 102 and exit 103 may be formed as a single entity, or, in other words, the substrate S may enter and exit the chamber 101 from the same gate valve.

The substrate S is an object (e.g., a wafer) having a deposition area. The deposition area may be an area on which an organic emission layer is to be formed; however, any other suitable material and/or formation may be fabricated. The substrate S may be a film formed of glass, a polymer resin, or a film having flexibility, such as stainless steel (SUS), etc.

A first chamber window 104, through which a laser beam L generated by a laser generation unit 150 propagates into the chamber 101, may be installed on a side wall of the chamber 101. A second chamber window 105, through which the laser beam L propagates from the chamber 101 to a laser absorption unit 170, may be installed on another side wall of the chamber 101 or another portion of the side wall including the first chamber window 104. In this manner, the first chamber window 104 is a window through which the laser beam L moves from outside of the chamber 101 to inside the chamber 101, and the second chamber window 105 is a window through which the laser beam L moves from inside the chamber 101 to outside of the chamber 101. The first chamber window 104 and the second chamber window 105 may be formed of quartz, however, any other suitable material may be utilized. If the laser generation unit 150 and the laser absorption unit 170 are installed inside the chamber 101, the first chamber window 104 and the second chamber window 105 may not be provided.

Figure 3:
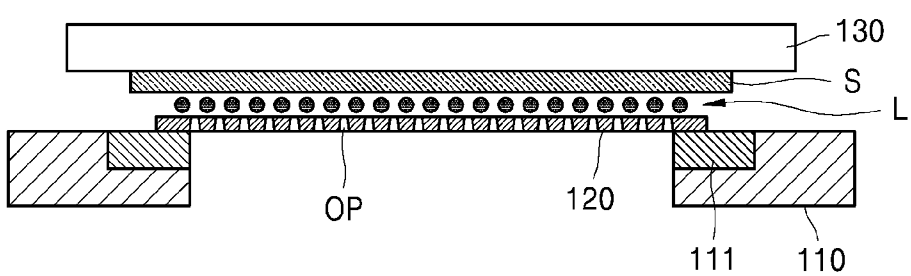
FIG. 3 is a side view of a laser beam emitted between a substrate and a mask in the deposition apparatus of FIG. 1, according to one or more exemplary embodiments.

A stage 110 may be installed (or otherwise supported) in the chamber 101. The stage 110 may support a frame 111, a mask 120, and an optical unit 160. The frame 110 may be installed in correspondence with an opening in the stage 110. The optical unit (or optical assembly) 160 may be arranged in a path through which the substrate S moves. The mask 120 may be installed in the frame 111. The mask 120 may be fixed to the frame 111 via tensile welding, however, any other suitable technique may be utilized. The mask 120 may be a plurality of divided masks in the form of a stick, or may be a single mask. The mask 120 may include a deposition pattern unit formed of a plurality of openings OP, such as illustrated in FIG. 3. A deposition material having passed through the deposition pattern unit may be deposited on the substrate S.

An electrostatic chuck 130 may be installed in the chamber 101. The electrostatic chuck 130 may be installed such that the electrostatic chuck 130 may move above the stage 110. For instance, the electrostatic chuck 130 may travel linearly or travel a round trip above the stage 110. For example, the electrostatic chuck 130 may be connected to a moving unit (not shown), such as a linear motor, a ball screw, a timing belt, a conveyor belt, or the like, and thus, may move to pass over the mask 120. The substrate S transported into the chamber 101 may be mounted on the electrostatic chuck 130. The electrostatic chuck 130 may be an electrostatic chuck that may electrostatically absorb the substrate S using an electrostatic force. The electrostatic chuck 130 may electrostatically absorb the substrate S using a bipolar-type electrode or a monopolar-type electrode. It is contemplated, however, that any other suitable type of chuck may be utilized in association with exemplary embodiments described herein.

A deposition source 140 for accommodating a deposition material may be installed on a bottom surface of the chamber 101. The deposition source 140 may be installed to correspond to the mask 120. The deposition source 140 may include a nozzle 141 for spraying a deposition material and a storage unit 142 for accommodating the deposition material. An evaporated deposition material may be sprayed toward the substrate S via the nozzle 141.

The laser generation unit (or laser generator) 150 may generate the laser beam L so that the laser beam L passes between the mask 120 and the substrate S. The laser generation unit 150 may be installed in the chamber 101 or outside the chamber 101. Hereinafter, the laser generation unit 150 will be described as being positioned outside the chamber 101 and the laser beam L propagates into the chamber 101 via the first chamber window 104 and out of the chamber 101 via the second chamber window 105. The laser generation unit 150 may include a laser source unit (or laser source) 151, a multi-beam generation unit (or multi-beam generator) 152, a lens unit (or lens) 155, and a first reflection unit (or first reflector) 156.

The laser source unit 151 emits a single laser beam La. The laser source unit 151 may emit a solid laser, such as a ruby laser, a glass laser, a yttrium aluminum garnet (YAG) laser, a yttrium lithium fluoride (YLF) laser, etc. The laser source unit 151 may be a gas laser, such as an excimer laser, a helium-neon (He—Ne) laser, etc. It is also contemplated that the laser source unit 151 may be a pulsed laser.

The multi-beam generation unit 152 may split the single laser beam La emitted from the laser source unit 151 by a desired amount. For example, the multi-beam generation unit 152 may include diffractive optical elements, and may be configured to convert the single laser beam La into a plurality of laser beams Lb. For example, a multi-beam generation unit 152 may split the single laser beam La into a plurality of laser beams L1 through Ln, "n" being a natural number greater than one (1). Additionally, the multi-beam generation unit 152 may adjust spaces between the laser beams L1 through Ln by rotating a diffraction optical device **152*a* along an optical axis and adjusting an angle at which the diffraction optical device 152*a* is rotated. The diffraction optical device 152*a* may diverge the incident laser beam La, in the form of a line, into the laser beams Lb in the form of a plurality of lines that have respectively different angles from each other. According to one or more exemplary embodiments, the multi-beam generation unit 152** may include a refraction optical device.

The lens unit 155 includes a first lens unit 153 having at least one lens and a second lens unit 154 having at least one lens. The lens unit 155 may determine a size of the laser beams Lb, obtained by diverging single laser beam La via the multi-beam generation unit 152, as a size of a laser beam that is used to mask a deposition material, and combine lenses that may change the plurality of laser beams Lb into parallel beams. In other words, as the plurality of laser beams L1 through Ln pass through the lens unit 155, a size of the plurality of laser beams L1 through Ln may be determined in correspondence with a size of a space between openings of the mask 120, and converted into parallel beams forming stripes of laser beams.

For example, the first lens unit 153 and the second lens unit 154 may include a plurality of lenses selectively combined with each other to form a collimating lens to convert the laser beams L into parallel beams, a focusing lens to concentrate the laser beams L, and/or an f-theta lens to maintain linearity of the laser beams L. Exemplary embodiments, however, are not limited thereto. The lens unit 155 may determine a size of a plurality of laser beams and change the plurality of laser beams into parallel beams by selectively using a cylinder lens, a spherical correcting lens, a toric lens, a scanning optical lens, and/or the like.

The first reflection unit 156 may be positioned in a path through which the laser beam L proceeds. A number of the first reflection units 156 is not limited to a particular number, and a plurality of the first reflection units 156 may be included according to a path through which the laser beams L proceed. For example, the first reflection unit 156 may change a path through which the laser beams L proceed such that the laser beams L are directed inside the chamber 101 via the first chamber window 104. If a first inspection sensor 181 detects that an end of the substrate S overlaps with the mask 120, the laser generation unit 150 may generate the laser beam L. Additionally, if a second inspection sensor 182 detects that another end of the substrate S is spaced apart from the mask 120, the laser generation unit 150 may stop the generation of the laser beam L.

The optical unit 160 may determine a path inside the chamber 101 through which the laser beam L proceeds. The optical unit 160 may guide the laser beam L, generated from the laser generation unit 150, to pass between the mask 120 and the substrate S. The optical unit 160 may guide the laser beam L so that the laser beam L is arranged parallel to a direction in which the substrate S moves. A plurality of the optical units 160 may be included and installed to face each other at opposing ends of the stage 110. In other words, a plurality of the optical units 160 may be arranged in a path through which the substrate S moves. At least a part of the optical unit 160 may be installed on the stage 110, and a height of the optical unit 160 may be changed according to movement of the substrate S so that the optical unit 160 may move out of the way of substrate S as it is displaced in chamber 101, e.g., as it travels from entrance 102 to exit 103.

The optical unit 160 may include a driving unit (or driver) 161, an elevation unit (or elevator) 162, a support unit (or support) 163, and a mirror unit (or mirror) 164. The driving unit 161 may be inserted into a groove of the stage 110, and may generate a driving force to change a height of the mirror unit 164. The elevation unit 162 may be provided as an axis connecting the support unit 163 to the driving unit 161, and may be raised or lowered using a driving force transmitted from the driving unit 161. For instance, the elevation unit 162 may be a telescopic tube configured to extend and retract according to a driving force transmitted from the driving unit 161, which may be configured as a motor. The mirror unit 164 may be installed at a side of (or otherwise supported by) the support unit 163, and another side of the support unit 163 may be connected to the elevation unit 162. The mirror unit 164 may change a direction in which the laser beam L is propagating, e.g., from a direction dictated by first reflection unit 156 to a space between the substrate S and the mask 120 or from a direction corresponding to the space between the substrate S and the mask 120 towards second reflection unit 171.

The laser absorption unit 170 may be arranged separate from the laser generation unit 150. Further, the laser absorption unit 170 may absorb the laser beam L having passing between the mask 120 and the substrate S. The laser absorption unit 170 may include a second reflection unit 171 and a laser absorber unit 172. A plurality of the second reflection units 171 may be installed to change a path through which the laser beam L having passed between the substrate S and the mask 120 proceeds. The laser absorber unit 172 may absorb the laser beam L that propagates outside chamber 101 via the second chamber window 105. The laser absorber unit 172 may include a housing 173 and an absorbent 175 installed in the housing 173. The laser beam L may be absorbed into the absorbent 175. A cooling unit 174 may be installed at a side of the housing 173. A plurality of cooling medium channels 176 may be arranged in the cooling unit 175. A cooling medium may flow in the plurality of cooling medium channels 176 to cool the housing 173 heated by the absorbed laser beam L. Water or a refrigerant may be used as a cooling medium.

An inspection sensor 180 is installed inside the chamber 101, and may detect movement of the substrate S. The inspection sensor 180 may detect whether at least a portion of the substrate S overlaps at least a portion of the mask 120 (or an area in which the mask 120 may be formed). Output of the inspection sensor 180 may be utilized to adjust elevation of the optical unit 160 by detecting movement of the substrate S above the mask 120. The inspection sensor 180 may include a first inspection sensor 181 for detecting whether the substrate S moves into a region where the mask 120 is disposed, and a second inspection sensor 182 for detecting whether the substrate S moves out of a region where the mask 120 is disposed.

If the first inspection sensor 181 detects an event in which the substrate S moves into a region for the mask 120, the optical unit 160 may be elevated, and the laser beam L may be generated from the laser generation unit 150. Additionally, output of the inspection sensor 180 may be utilized to control deposition source 140. For instance, a deposition material may be sprayed from the deposition source 140 according to an output of first inspection sensor 181, and, thus, deposited on the substrate S. In other words, if the first inspection sensor 181 detects movement of the substrate to into a region of the mask 120, a deposition process may be performed by the deposition apparatus 100.

If the second inspection sensor 182 detects an event in which the substrate S moves out of a region corresponding to the mask 120, the optical unit 160 may be lowered, and the laser generation unit 150 may stop the generation of the laser beam L. Additionally, the deposition source 140 may stop spraying the deposition material. In other words, if the second inspection sensor 182 detects movement of the substrate out of a region corresponding to the mask 120, the deposition apparatus 100 may stop the deposition process.

Although not illustrated, deposition apparatus 100 may include or otherwise be associated with a controller to control and receive output from one or more components of deposition apparatus 100, such as the entrance 102, the exit 103, the laser generation unit 150, the first reflection unit 156, the second reflection unit 171, the optical unit 160, the electrostatic chuck 130, the laser absorption unit 171, the deposition source 140, etc. The controller and/or one or more components thereof, may be implemented via one or more general purpose and/or special purpose components, such as one or more discrete circuits, digital signal processing chips, integrated circuits, application specific integrated circuits, microprocessors, processors, programmable arrays, field programmable arrays, instruction set processors, and/or the like.

According to one or more exemplary embodiments, the features, functions, processes, etc., described herein may be implemented via software, hardware (e.g., general processor, digital signal processing (DSP) chip, an application specific integrated circuit (ASIC), field programmable gate arrays (FPGAs), etc.), firmware, or a combination thereof. In this manner, the controller and/or one or more components thereof may include or otherwise be associated with one or more memories (not shown) including code (e.g., instructions) configured to cause the deposition apparatus 100 and/or one or more components thereof to perform one or more of the features, functions, processes, etc., described herein. The memories may be any medium that participates in providing code to the one or more software, hardware, and/or firmware components for execution. Such memories may be implemented in any suitable form, including, but not limited to, non-volatile media, volatile media, and transmission media.

Figure 4:
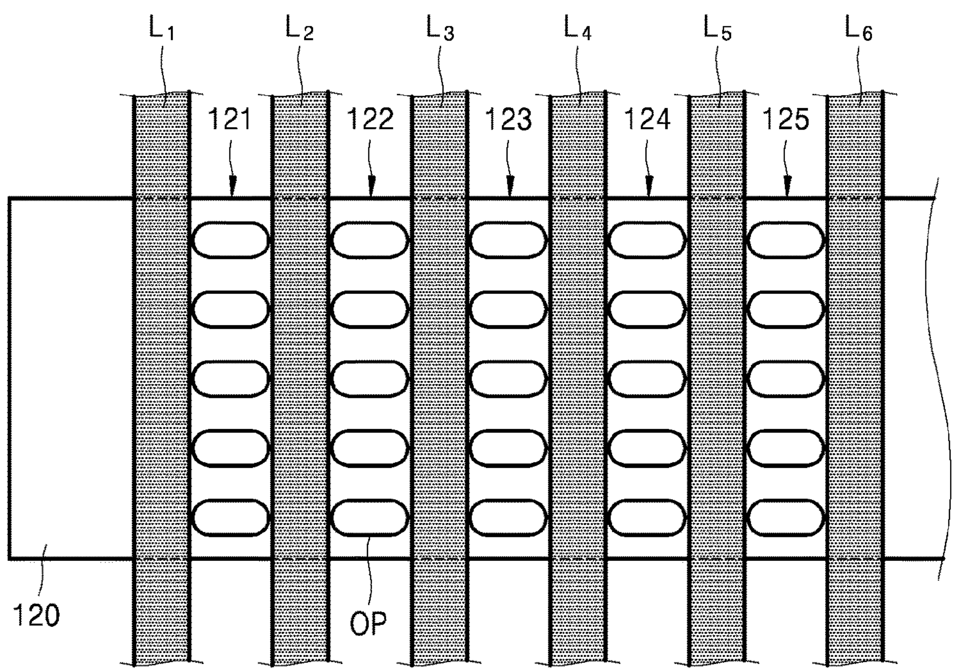
FIG. 4 is a plan view of a laser beam emitted towards a top surface of a mask in the deposition apparatus of FIG. 1, according to one or more exemplary embodiments.

FIG. 3 is a side view of a laser beam emitted between a substrate and a mask in the deposition apparatus of FIG. 1, according to one or more exemplary embodiments. FIG. 4 is a plan view of a laser beam emitted towards a top surface of a mask in the deposition apparatus of FIG. 1, according to one or more exemplary embodiments.

Referring to FIGS. 3 and 4, a plurality of the laser beams L may pass between the mask 120 and the substrate S. The plurality of the laser beams L may be disposed at an outer area of a deposition pattern unit included in the mask 120. In other words, the plurality of the laser beams L may be disposed between openings OP of the mask 120. Further, the plurality of the laser beams L may be formed to have a stripe shape, and arranged parallel to a direction in which the substrate S can move, e.g., from entrance 102 to exit 103.

A deposition material evaporated from the deposition source 140 may pass through the openings OP of the mask 120, and, then, may move into a space between the substrate S and the mask 120. Since a plurality of the laser beams L are formed outside of the openings OP, the deposition material may pass through the plurality of the laser beams L, and, then, be deposited on the substrate S. However, if the deposition material collides with a laser beam of the plurality of the laser beams L, a molecular chain of the deposition material, for example, an organic material, will be cut and the deposition material may not perform its function as an organic material. In this manner, the deposition material can be prevented from be deposited on substrate S (or a layer formed thereon).

Referring to FIG. 4, the deposition pattern unit may be a combination of a first pattern unit 121, a second pattern unit 122, a third pattern unit 123, a fourth pattern unit 125, and a fifth pattern unit 125. It is contemplated, however, that any suitable number of pattern units may be provided in association with exemplary embodiments described herein. A first laser beam $L_1$ may be arranged at left of the first pattern unit 121, a second laser beam $L_2$ may be arranged between the first pattern unit 121 and the second pattern unit 122, a third laser beam $L_3$ may be arranged between the second pattern unit 122 and the third pattern unit 123, a fourth laser beam $L_4$ may be arranged between the third pattern unit 123 and the fourth pattern unit 124, a fifth laser beam $L_5$ may be arranged between the fourth pattern unit 124 and the fifth pattern unit 125, and a sixth laser beam $L_6$ may be arranged at right of the fifth pattern unit 125. It is noted that the number of laser beams L may be configured based on an associated number of pattern units provided. Since the first through sixth laser beam $L_1$ through $L_6$ vaporize a deposition material sprayed outside of the opening OPs, precision of a position pattern formed on the substrate S may be enhanced.

Additionally, a plurality of deposition materials may be deposited on the substrate S by adjusting a size of each laser beam L (or the number of the plurality of the laser beams L). The deposition materials may pass through only some of the openings OP of the mask 120 by adjusting a size or arrangement of the laser beams L. For example, a first deposition material may be deposited on the substrate S using the first pattern unit 121 and the fourth pattern unit 124, a second deposition material may be deposited on the substrate S using the second pattern unit 122 and the fifth pattern unit 125, and a third deposition material may be deposited on the substrate S using the third pattern unit 123.

If the first deposition material is to be deposited on the substrate S, the second pattern unit 122, the third pattern unit 123, and the fifth pattern unit 125 may be obstructed by a plurality of the laser beams L by adjusting a size of one or more of the plurality of the laser beams L or moving a location of the one or more of the plurality of the laser beams L. In this manner, the first deposition material having passed through the first pattern unit 121 and the fourth pattern unit 124 may be deposited on the substrate S. As such, the second deposition material having passed through the second pattern unit 122 and the fifth pattern unit 125 may be deposited on the substrate S, and the third deposition material having passed through the third pattern unit 123 may be deposited on the substrate S.

According to one or more exemplary embodiments, the deposition apparatus 100 may enhance precision of deposition process by reducing an error in a deposition pattern on the substrate S by arranging a plurality of the laser beams L in correspondence with the deposition pattern unit included in the mask 120. A portion of the deposition material having passed through the deposition pattern unit included in the mask 120 and between a plurality of the laser beams L may be deposited on a deposition area of the substrate S, and another portion of the deposition material that may contact at least one of the plurality of the laser beams L may not be deposited on the deposition area of the substrate S. As such, the deposition material may be deposited precisely on the substrate S. Further, the deposition apparatus 100 may include the optical unit 160 whose height may be adjusted, and, thus, efficiency of a process may be enhanced. As the optical unit 160 sets a plurality of the laser beams L to pass between the substrate S and the mask 120 only when the substrate S passes in an area corresponding to the mask 120, efficiency of a deposition process and space utilization may be enhanced.

Figure 5:
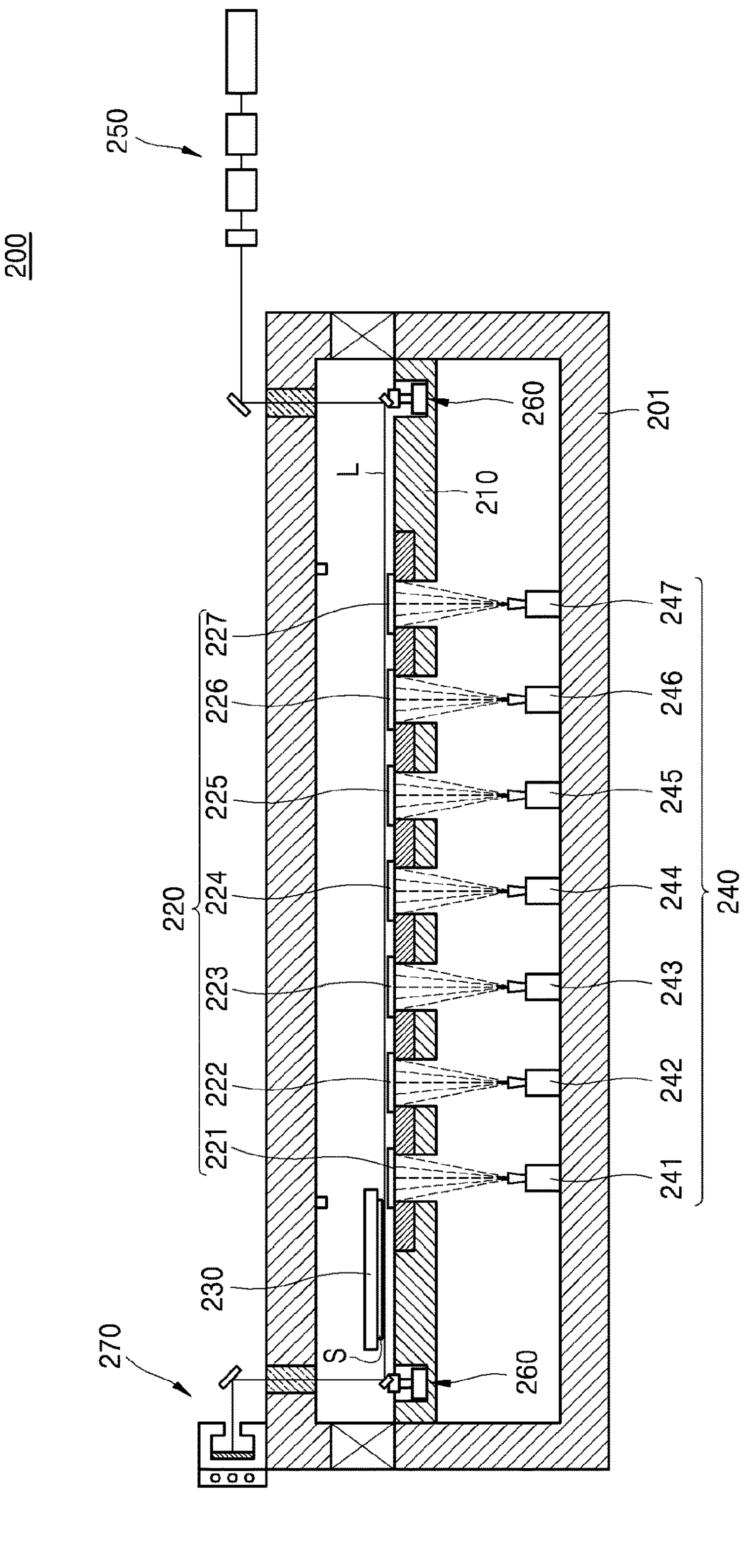
FIG. 5 is a conceptual diagram of a cross-sectional view of a deposition apparatus, according to one or more exemplary embodiments.

FIG. 5 is a conceptual diagram of a cross-sectional view of a deposition apparatus, according to one or more exemplary embodiments. Deposition apparatus 200 of FIG. 5 is similar to deposition apparatus 100 of FIG. 1. As such, duplicative descriptions have been primarily omitted to avoid obscuring exemplary embodiments described herein.

As seen in FIG. 5, the deposition apparatus 200 may include a chamber 201, a stage 210, a plurality of masks 220, an electrostatic chuck 230, a plurality of deposition sources 240, a laser generation unit 250, an optical unit 260, a laser absorption unit 270, and one or more inspection sensors. The chamber 201, the stage 210, the electrostatic chuck 230, the laser generation unit 250, the optical unit 260, the laser absorption unit 270, and the inspection sensor(s) of the deposition apparatus 200 are substantially identical to the chamber 101, the stage 110, the electrostatic chuck 130, the laser generation unit 150, the optical unit 160, the laser absorption unit 170, and the inspection sensor 180 included in the deposition apparatus 100 of FIG. 1, and, as such, the plurality of masks 220 and the plurality of deposition sources 240 are described hereinafter.

The plurality of masks 220 may be arranged in line according to a direction in which the substrate S moves. FIG. 5 shows installation of first through seventh mask 221 through 227 on the stage 210, however, a number of the plurality of masks 220 is not limited to a particular number, and may vary depending on a number of organic materials to be deposited on the substrate S or a number of deposition layers.

The plurality of deposition sources 240 may be installed inside the chamber 201 in correspondence with the plurality of masks 220. In this manner, the first through seventh deposition sources 241 through 247 may be installed in correspondence with the first through seventh masks 221 through 227. Each deposition source may be sprayed toward each mask corresponding thereto, and, thus, may form a deposition layer on the substrate S as substrate S traverses over the corresponding deposition source. The plurality of deposition sources 240 may spray a same deposition material or may spray deposition materials respectively different from each other or different from at least one of the other deposition sources. Since the plurality of masks 220 and the plurality of deposition sources 240 are installed in line along a direction in which the substrate S moves, a plurality of deposition materials may be deposited on the substrate S using a minimized (e.g., faster, more efficient, etc.) deposition process.

Figure 6:
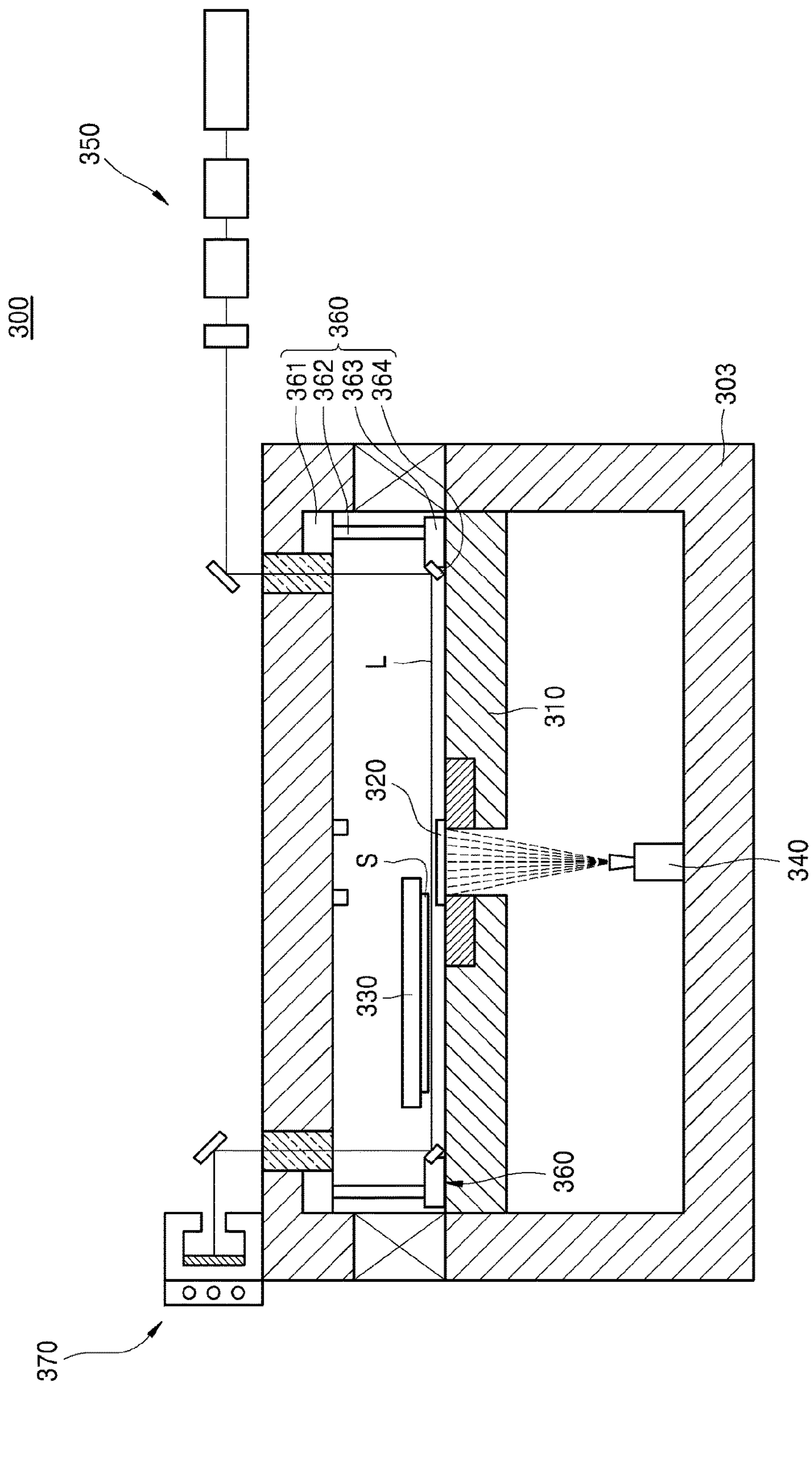
FIG. 6 is a conceptual diagram of a cross-sectional view of a deposition apparatus, according to one or more exemplary embodiments.

FIG. 6 is a conceptual diagram of a cross-sectional view of a deposition apparatus, according to one or more exemplary embodiments. Deposition apparatus 300 of FIG. 6 is similar to deposition apparatus 100 of FIG. 1. As such, duplicative descriptions have been primarily omitted to avoid obscuring exemplary embodiments described herein.

The deposition apparatus 300 may include a chamber 303, a mask 320, an electrostatic chuck 330, a deposition source 340, a laser generation unit 350, an optical unit 360, a laser absorption unit 370, and one or more inspection sensors. The chamber 303, the stage 310, the mask 320, the electrostatic chuck 330, the deposition source 340, the laser generation unit 350, the laser absorption unit 370, and the inspection sensor(s) included in the deposition apparatus 300 are substantially identical to the chamber 101, the stage 110, the electrostatic chuck 130, the deposition source 140, the laser generation unit 150, the laser absorption unit 170, and the inspection sensor 180 included in the deposition apparatus 100 of FIG. 1. As such, the optical units 360 are described hereinafter.

As seen in FIG. 6, the optical unit 360 may determine a path inside the chamber 301 through which the laser beam L proceeds. The optical unit 360 may guide the laser beam L, generated from the laser generation unit 350, to pass between the mask 320 and the substrate S. The optical unit 360 may guide the laser beam L so that a path through which the laser beam L proceeds substantially matches a path through which the substrate S moves.

A plurality of the optical units 360 may be included, and installed to face each other, e.g., at opposing ends of stage 310. For instance, the plurality of the optical units 360 may be installed to face each other at an entrance and an exit of the chamber 303. At least a portion of the optical unit 360 may be installed to be inserted into the chamber 303, and a height of the optical unit 360 may be changed according to movement of the substrate S such that the optical unit 360 linearly moves toward and away from the stage 310.

The optical unit 360 may include a driving unit (or driver) 361, an elevation unit (or elevator) 362, a support unit (or support) 363, and a mirror unit (or mirror) 364. The driving unit 361 may be inserted into a groove of the chamber 303, and may generate a driving force to change a height of the mirror unit 364. The elevation unit 362 may be provided as an axis connecting the support unit 363 to the driving unit 361, and may be raised or lowered using a driving force transmitted from the driving unit 361. For instance, the elevation unit 162 may be a telescopic tube configured to extend and retract according to a driving force transmitted from the driving unit 161, which may be configured as a motor. The mirror unit 364 may be installed at a side of (or otherwise supported by) the support unit 363, and the other side of the support unit 163 may be connected to the elevation unit 362. The mirror unit 364 may change a direction, in which a laser beam L is propagating, e.g., from a direction dictated by a first reflection unit to a space between the substrate S and the mask 320. Since the optical unit 360 may move to adjust a height of the elevation unit 362, a height of the mirror unit 364 may be adjusted so that the laser beam L can pass through a space between the substrate S and the mask 320, but also enable the substrate S to be easily disposed in chamber 303.

Figure 7A:
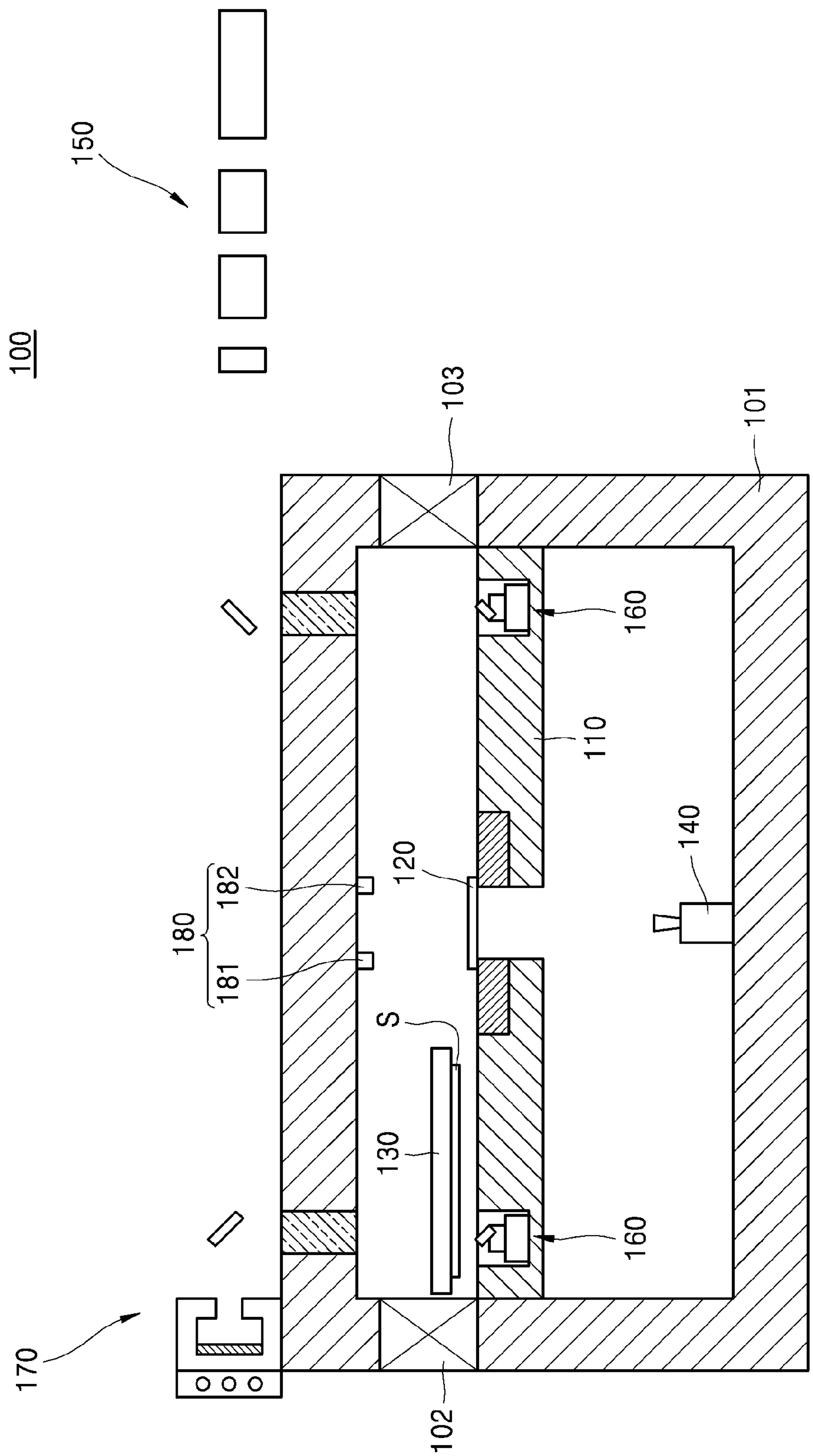
FIGS. 7A, 7B, and 7C are cross-sectional views of an organic light-emitting diode (OLED) display apparatus at various stages of manufacture using the deposition apparatus of FIG. 1, according to one or more exemplary embodiments.
Figure 7B:
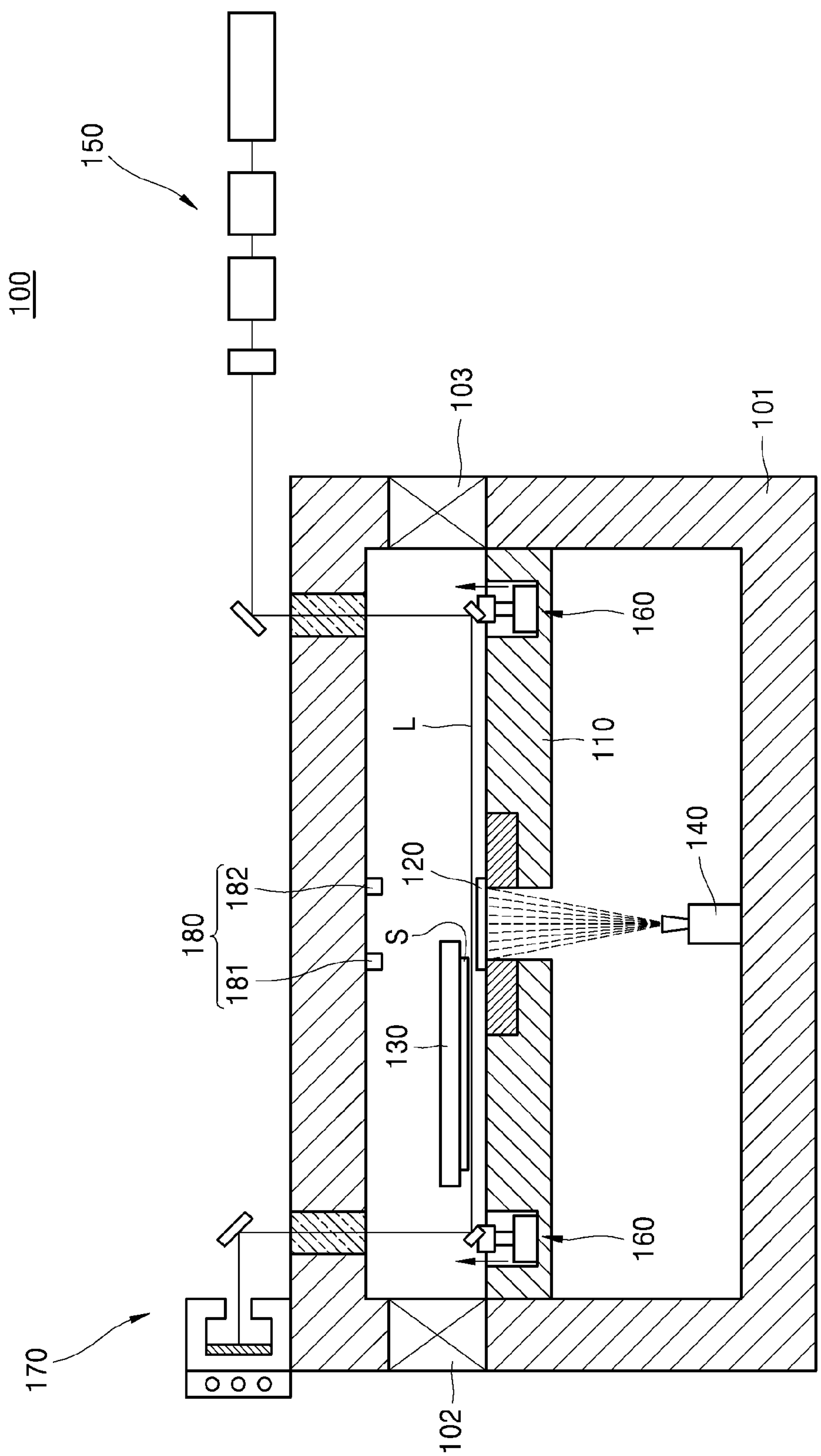
Figure 7C:
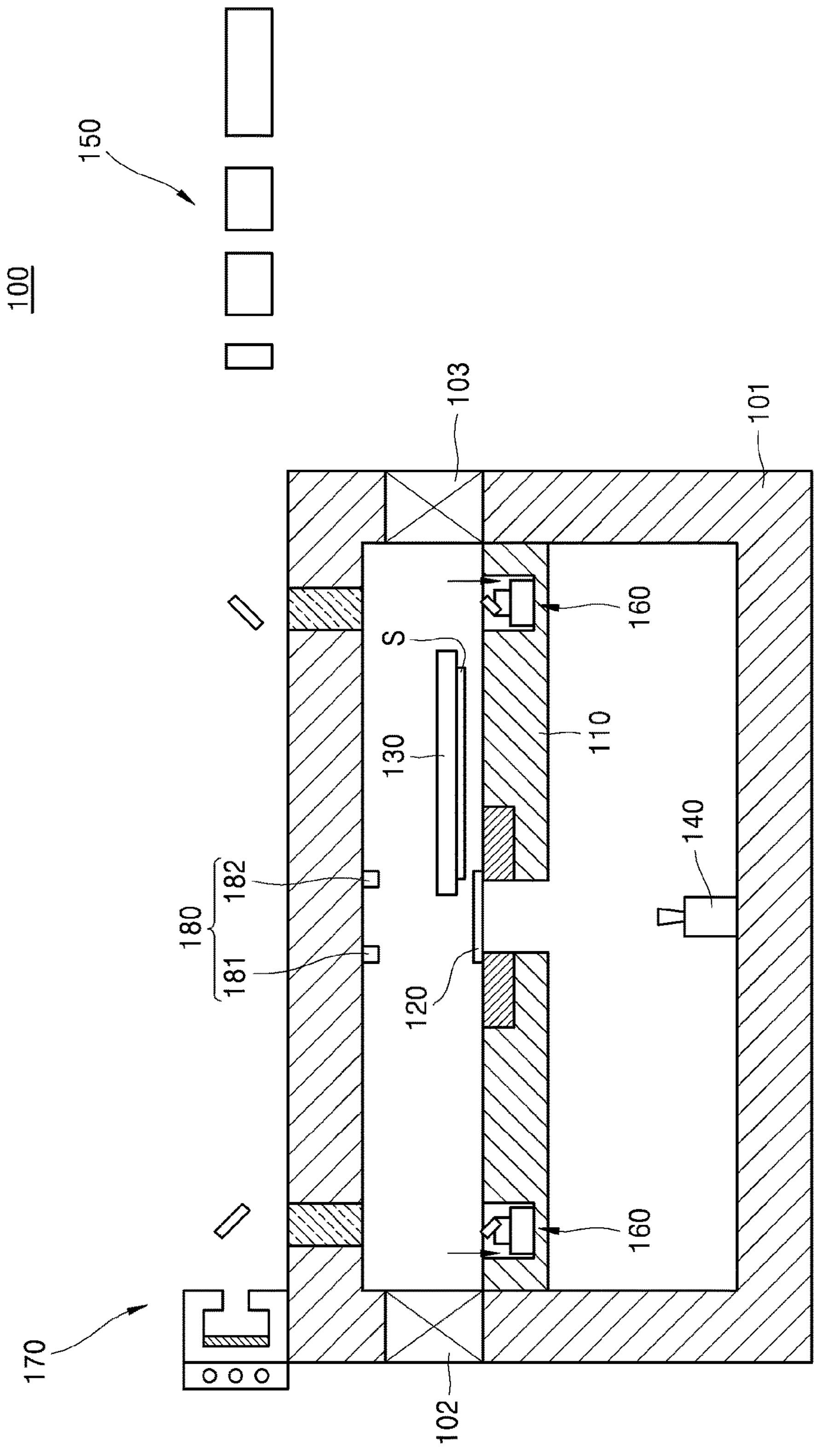

FIGS. 7A, 7B, and 7C are cross-sectional views of an organic light-emitting diode (OLED) display apparatus at various stages of manufacture using the deposition apparatus of FIG. 1, according to one or more exemplary embodiments.

Referring to FIG. 7A, the substrate S may be transported into the chamber 101, and, as such, mounted on the electrostatic chuck 130. The optical unit 160 may be positioned in grooves of the stage 110, and, thereby, out of the way of the substrate S and the electrostatic chuck 130. In this manner, the substrate S and the electrostatic may have sufficient space to make disposing the substrate S in chamber 101 relatively easy and unobstructed.

Referring to FIG. 7B, the electrostatic chuck 130 may linearly move above the mask 120 arranged on the stage 110. If the electrostatic chuck 130 moves in a field of detection of the first inspection sensor 181, the first inspection sensor 181 will detect the movement of the substrate S and the optical unit 160 installed at an end of the stage 110 may be elevated to a determined height and positioned in a predetermined location. In this manner, the optical unit 160 may enable the laser beam L to pass between the substrate S and the mask 120. Further, the laser beam L generated from the laser generation unit 150 may be reflected from the optical unit 160, and, as such, pass between the mask 120 and the substrate S. To this end, the laser beam L may be arranged in an outer area of a deposition pattern unit included in the mask 120.

For example, a single laser beam L is generated from the laser source unit 151 and passes through the multi-beam generation unit 152. In this manner, the laser beam diverges in correspondence with openings of the mask 120. The multi-beam generation unit 152 may include diffractive optical elements 152*a*, and may convert the single laser beam into a plurality of laser beams L. The plurality of laser beams L may pass through the first lens unit 153 and the second lens unit 154 in which a plurality of lenses are combined, and, thus, the plurality of laser beams L may be changed to correspond to a deposition area of the substrate S. For example, the first lens unit 153 and the second lens unit 154 may determine a size of the plurality of laser beams L, obtained by the diverging by the multi-beam generation unit 152, as a size of a laser beam L used to mask a deposition material, and change the plurality of laser beams L into parallel beams for a deposition process.

When the substrate S passes over a region corresponding to the mask 120, a deposition material is evaporated from the deposition source 140 installed in the chamber 101. The evaporated deposition material may pass through the mask 120, and, as such, be deposited on the substrate S. The deposition material may pass through the deposition pattern unit included in the mask 120, pass through a space between the plurality of laser beams L, and, then, be deposited on a deposition area of the substrate S. The deposition material colliding with the plurality of laser beams L may be vaporized, and, thus, may be prevented from performing a function and prevented from being deposited on substrate S. The vaporized deposition material may be removed by a collection apparatus (not shown).

The plurality of laser beams L, having passed between the mask 120 and the substrate S, may be redirected by an optical unit 160 and second reflection unit 171 and absorbed by the laser absorption unit 170. The plurality of laser beams L emitted from the chamber 101 is absorbed into the absorbent 175. The housing 173 heated by the plurality of laser beams L may be cooled by the cooling unit 174.

Referring to FIG. 7C, when the substrate S passes from an area corresponding to the mask 920, a height of the optical unit 160 may be changed. The second inspection sensor 182 may detect movement of the substrate S from the area corresponding to the mask 120. If movement of the substrate S out of the area of the mask 120 is detected, the driving unit 161 in the optical unit 160 may be driven, and, as such, a height of the mirror unit 164 is decreased. In other words, the optical unit 160 may be inserted into the stage 110 so that the substrate S can be easily transported outside of the chamber 101 via the exit 103. Additionally, if the substrate S passes through the area corresponding to the mask 120, the deposition source 140 may stop spraying the deposition material. In this manner, deposition material may be conserved.

According to one or more exemplary embodiments, the optical unit 160 whose height may be adjusted may be arranged in a path through which the substrate S moves, such that the substrate S may linearly move in a direction to have a certain space with the mask 920. The optical unit 160 is not limited to an optical unit whose height may be adjusted on the stage 110. For instance, as shown in FIG. 6, the optical unit 160 may be fixed at a side of the chamber 101 to adjust a height of the optical unit 160.

Figure 8:
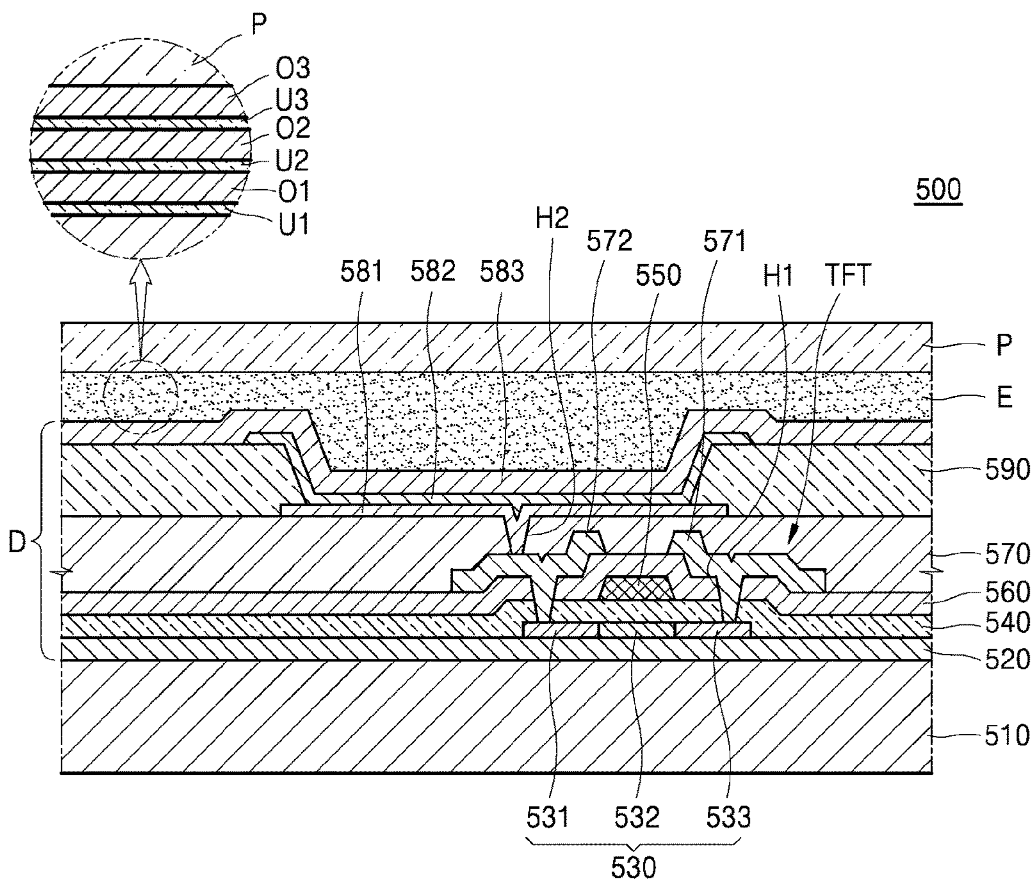
FIG. 8 is a cross-sectional view of a portion of an OLED display apparatus manufactured using the deposition apparatus of FIG. 1, according to one or more exemplary embodiments.

FIG. 8 is a cross-sectional view of a portion of an OLED display apparatus manufactured using the deposition apparatus of FIG. 1, according to one or more exemplary embodiments. For instance, the portion of the OLED display apparatus 500 may be a pixel (or sub-pixel) of the OLED display apparatus 500. Hereinafter, an example in which the portion corresponds to a sub-pixel is described in more detail.

According to one or more exemplary embodiments, sub-pixels of the OLED display apparatus 500 may include at least one thin-film transistor TFT, and an organic light-emitting device. The thin-film transistor TFT is not limited to having a structure shown in FIG. 8, and a number and a structure of the thin-film transistor TFT may be variously modified. As seen in FIG. 8, the OLED display apparatus 500 may include a substrate 510, a display unit D, an encapsulation unit E, and a protection layer P.

The substrate 510 may be formed of a flexible insulating material. For example, the substrate 510 may be a polymer substrate formed of polyimide (PI), polycarbonate (PC), polyethersulphone (PES), polyethylene terephthalate (PET), polyethylene naphthalate (PEN), polyarylate (PAR), fiber glass reinforced plastic (FRP), and/or the like. According to one or more exemplary embodiments, the substrate 510 may be a glass substrate having a thickness to such a degree that the substrate 510 may be bent. The substrate 510 may be formed of a metal material. The substrate 510 may be transparent, translucent, or opaque.

A buffer layer 520 formed of an organic compound and/or an inorganic compound may be further formed on a top surface of the substrate 510. The buffer layer 520 may obstruct oxygen and moisture, and may planarize a surface of the substrate 510. The buffer layer 520 may be formed of a material selected from an inorganic material, such as silicon dioxide ($SiO_2$), silicon nitride ($SiN_x$), silicon oxynitride ($SiO_xN_y$), aluminum oxide ($AlO_x$), or aluminum oxynitride ($AlO_xN_y$), or an organic material, such as acryl, polyimide, or polyester.

The thin-film transistor TFT may be formed on the buffer layer 520. According to one or more exemplary embodiments, the thin-film transistor TFT refers to a top gate transistor; however, a thin-film transistor having another structure, such as a bottom gate transistor, may be included as the thin-film transistor TFT.

After an active layer 530 having a certain pattern is formed on the buffer layer 520, the active layer 530 is buried by a gate insulating layer 540. The active layer 530 has a source area 531 and a drain area 533, and further includes a channel area 532 therebetween. The active layer 530 may be formed to contain various materials. For example, the active layer 530 may contain an inorganic semiconductor material, such as amorphous silicon or crystalline silicon. As another example, the active layer 530 may contain an oxide semiconductor. For instance, an oxide semiconductor may include an oxide of a material selected from a metal element in a group 12, 13, or 14, such as zinc (Zn), indium (In), gallium (Ga), tin (Sn), cadmium (Cd), germanium (Ge), or hafnium (Hf), or a combination thereof. Hereinafter, an example in which the active layer 530 is formed of amorphous silicon is described in detail.

A gate electrode 550 corresponding to the active layer 530 and an interlayer insulating layer 560 that buries the gate electrode 550 are formed on a top surface of the gate insulating layer 540. After a contact hole H1 is formed on the interlayer insulating layer 560 and the gate insulating layer 540, a source electrode 571 and a drain electrode 572 are formed on the interlayer insulating layer 560 to respectively contact the source area 531 and the drain area 533.

A passivation layer 570 is formed on a top surface of the thin-film transistor TFT, and a pixel electrode 581 of the OLED display apparatus 500 is formed on the passivation layer 570. The pixel electrode 581 may be a transparent (or translucent) electrode or a reflective electrode. If the pixel electrode 581 is a transparent (or translucent) electrode, the pixel electrode 581 may be formed of, for example, indium tin oxide (ITO), indium zinc oxide (IZO), zinc oxide (ZnO), indium oxide ($In_2O_3$), indium gallium oxide (IGO), or aluminum zinc oxide (AZO). If the pixel electrode 581 is a reflective electrode, the pixel electrode 581 may include a reflective layer formed of silver (Ag), magnesium (Mg), Al, platinum (Pt), palladium (Pd), gold (Au), nickel (Ni), neodymium (Nd), iridium (Ir), chrome (Cr), or a compound thereof, and a layer formed of ITO, IZO, ZnO, or $In_2O_3$. However, a constitution and a material of the pixel electrode 581 is not limited thereto, and may be variously modified.

The pixel electrode 581 contacts the drain electrode 572 of the thin-film transistor (TFT) via a via hole H2 formed in the passivation layer 570. The passivation layer 570 may be formed of an inorganic and/or organic material, or formed to have a single layer or two or more layers. The passivation layer 570 may be formed as a planarization layer so that a top surface is smooth regardless of unevenness of a lower layer. However, the passivation layer 750 may also be formed to be uneven according to unevenness of a layer below the passivation layer 750. In addition, the passivation layer 570 may be formed of a transparent insulator so that a resonant effect may be obtained.

After the pixel electrode 581 is formed on the passivation layer 570, a pixel-defining layer 590 is formed of an organic and/or inorganic material to cover the pixel electrode 581 and the passivation layer 570, and to have an opening to expose the pixel electrode 581. In addition, an intermediate layer 582 and an opposite electrode 583 are formed on the pixel electrode 581. The pixel electrode 581 functions as an anode electrode, and the opposite electrode 583 functions as a cathode electrode. However, polarities of the pixel electrode 581 and the opposite electrode 583 may be changed with each other. The pixel electrode 581 and the opposite electrode 583 are insulated from each other by the intermediate layer 582. An organic emission layer emits light as voltages having different polarities from each other are applied to the intermediate layer 582.

The intermediate layer 582 may include an organic emission layer. As another selective example, the intermediate layer 582 may include the organic emission layer, and further include at least one selected from the group consisting of a hole injection layer (HIL), a hole transport layer (HTL), an electron transport layer (ETL), and an electron injection layer (EIL).

Although a light emitting material is separately included in the respective pixels in the organic light emission layer according to exemplary embodiments as descried above, the present inventive concept is not limited thereto. The organic light emission layer may be a common organic light emission layer usable for the entire pixels regardless of locations of the pixels. Here, the organic light emission layer may include light emitting materials to respectively emit red light, green light, and blue light, for example. The light emitting materials may be stacked in a vertical direction or disposed in a mixed manner. The light emitting materials may include materials to emit a combination of different colors as long as white light is emitted from the combination of the different colors. A color conversion layer or a color filter may be further included to convert the emitted white light to a certain color.

After the display unit D is formed on the substrate 510, the encapsulation layer E may be formed on the display unit D. The encapsulation layer E may include a plurality of inorganic layers, or an inorganic layer and an organic layer. For instance, an organic layer of the encapsulation layer E is formed of a polymer material, and may be a single layer formed of one selected from polyethylene terephtalate, polyimide, polycarbonate, epoxy, polyethylene, and polyacrylate, or layers in which such materials are stacked on top of each other. The organic layer may be formed of polyacrylate, and may include a material obtained by polymerizing a monomer composition that includes diacrylate-based monomer and triacrylate-based monomer. Monoacrylate-based monomer may be further included in the monomer composition. A wen-n known photoinitiator, such as a thermoplastic polyolefin (TPO), may be included in the monomer composition. However, the monomer composition is not limited thereto, and may include epoxy, polyimide, polyethylene terephthalate, polycarbonate, polyethylene, or polyacrylate.

The organic layer included in the encapsulation layer E may be a single layer or stacked layers that include metal oxide or metal nitride. For example, the inorganic layer may include one selected from $SiO_2$, SiNx, $Al_2O_3$, titanium oxide ($TiO_2$), zirconium oxide (ZrOx), and ZnO. An uppermost layer in the encapsulation layer E, exposed to an outside, may be formed of an inorganic layer to prevent moisture from penetrating into the OLED.

The encapsulation layer E may include at least one sandwich structure in which at least one organic layer is inserted between at least two inorganic layers. As another example, the encapsulation layer E may include at least one sandwich structure in which at least one inorganic layer is inserted between at least two organic layers. For example, as seen in an enlarged portion P, the encapsulation layer E may include a first inorganic layer U1, a first organic layer O1, a second inorganic layer U2, a second organic layer O2, a third inorganic layer U3, and a third organic layer O3 sequentially formed from a top of the OLED.

A halogenated metal layer that includes lithium-fluoride (LiF) may be further included between the OLED and the first inorganic layer U1. The halogenated metal layer may prevent damage to the OLED when the first inorganic layer U1 is formed using, for example, a sputtering method. An area of the first organic layer O1 may be smaller than an area of the second inorganic layer U2, and an area of the second organic layer O2 may be smaller than an area of the third inorganic layer U3. However, the encapsulation layer E is not limited thereto, and may include any structure in which an inorganic layer and an organic layer are stacked on top of each other in various forms.

The protection layer P may be formed on the encapsulation layer E. The protection layer P may be formed using various methods. For example, the protection layer P may be formed using a sputtering method, an ion beam deposition method, an evaporation method, a general chemical vapor deposition method, or the like. The protection layer P may include a metallic oxide or nitride, such as $SiN_x$, $SiO_xN_y$, titanium oxide ($TIO_x$), titanium nitride ($TIN_x$), titanium oxynitride ($TiO_xN_y$), $ZrO_x$, tantalum nitride ($TaN_x$), tantalum oxide ($TaO_x$), hafnium oxide ($HfO_x$), $AlO_x$, or the like. The protection layer P may be formed to completely surround a side of the encapsulation layer E. Accordingly, the protection layer P may increase life expectancy of the encapsulation layer E by obstructing the encapsulation layer E from moisture or oxygen.

According to one or more exemplary embodiments, the OLED display apparatus 500 may be applied to an organic light-emitting display apparatus having flexibility and an organic light-emitting display apparatus having rigidity.

Figure 9:
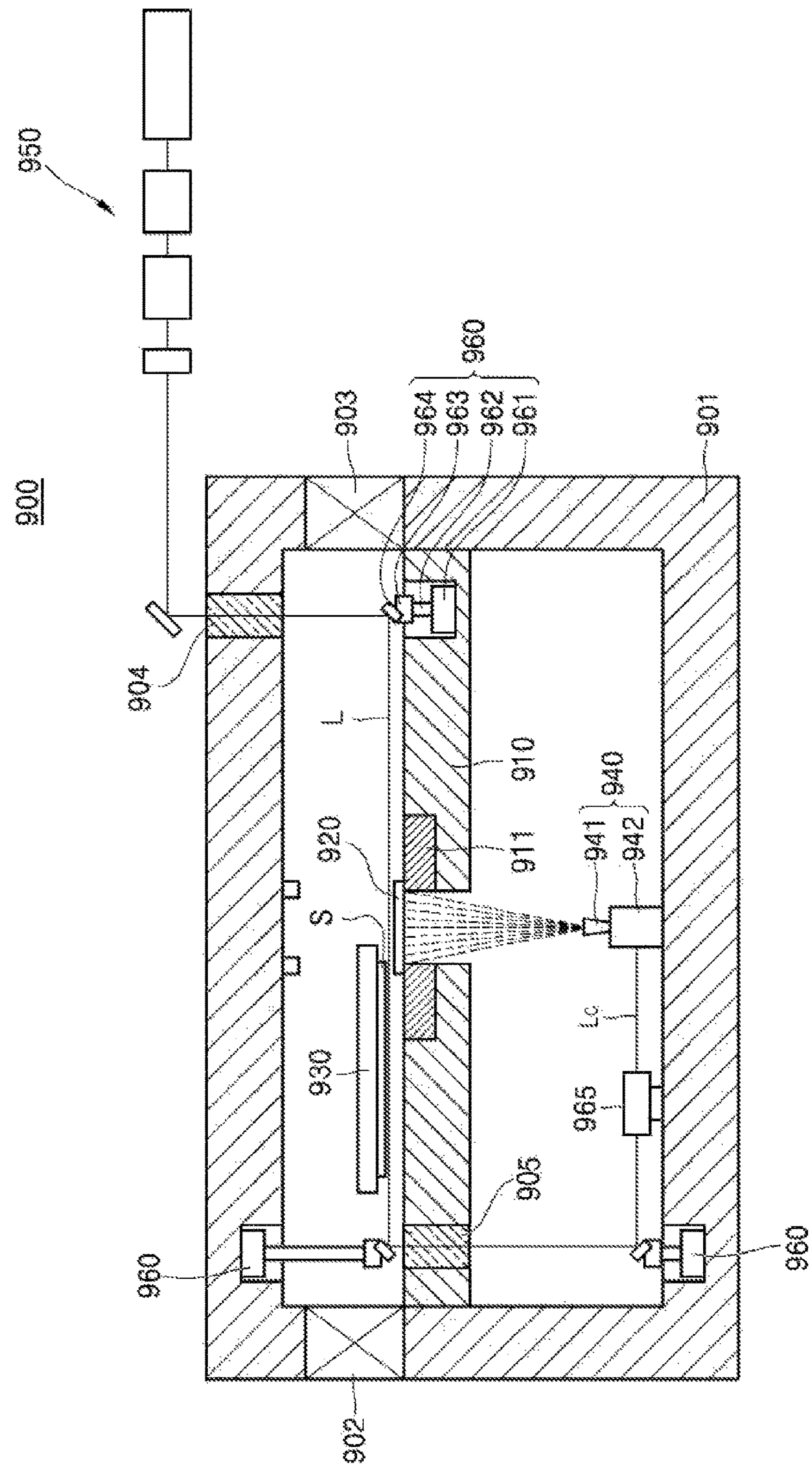
FIG. 9 is a conceptual diagram of a cross-sectional view of a deposition apparatus, according to one or more exemplary embodiments.

FIG. 9 is a conceptual diagram of a cross-sectional view of a deposition apparatus, according to one or more exemplary embodiments. Deposition apparatus 900 of FIG. 9 is similar to deposition apparatus 100 of FIG. 1. As such, duplicative descriptions have been primarily omitted to avoid obscuring exemplary embodiments described herein.

The deposition apparatus 900 may include a chamber 901, a stage 910, a frame 911, a mask 920, an electrostatic chuck 930, a deposition source 940, a laser generation unit 950, an optical unit 960, and inspection sensor 980. The frame 911, the mask 920, the electrostatic chuck 930, the laser generation unit 950, and the inspection sensor 980 included in the deposition apparatus 900 are substantially identical to the frame 111, the electrostatic chuck 130, the laser generation unit 150, and the inspection sensor 180 included in the deposition apparatus 100 of FIG. 1. As such, aspects of the chamber 901, the stage 910, the deposition source 940, and the optical units 960 are described hereinafter.

As seen in FIG. 9, the deposition apparatus 900 includes the chamber 901 configured to provide a pressurized space (e.g., a vacuum environment) separate from an external (e.g., ambient) environment. The chamber 901 may be held under condition(s) to ensure linearity of a deposition material, such as by maintaining a certain degree of vacuum. An entrance 902 (e.g., a first gate valve) into which a substrate S is transported inside the chamber 901 may be installed in a side wall of the chamber 901, and an exit 903 (e.g., a second gate valve) from which the substrate S may be transported outside the chamber 901 may be installed on another side wall of the chamber 901. A location of the entrance 902 and/or the exit 903 is not limited to a particular location, and a size of the entrance 902 and/or the exit 903 is not limited to a particular size. It is also contemplated that the entrance 902 and exit 903 may be formed as a single entity, or, in other words, the substrate S may enter and exit the chamber 901 from the same gate valve.

A first chamber window 904, through which a laser beam L generated by a laser generation unit 950 propagates into the chamber 101, may be installed in a side wall of the chamber 901. A second window 905, through which the laser beam L propagates from above stage 910 to below stage 910, may be installed in stage 910. Stage 910 may include frame 911, which may be configured similar to frame 101. The first chamber window 904 and the second chamber window 905 may be formed of quartz, however, any other suitable material may be utilized. If the laser generation unit 950 is installed inside the chamber 901, the first chamber window 904 may not be provided.

A deposition source 940 for accommodating a deposition material may be installed on a bottom surface of the chamber 901. The deposition source 940 may be installed to correspond to the mask 920. The deposition source 940 may include a nozzle 941 for spraying a deposition material and a storage unit 942 for accommodating the deposition material. An evaporated deposition material may be sprayed toward the substrate S via the nozzle 941.

The laser generation unit (or laser generator) 950 may generate the laser beam L so that the laser beam L passes between the mask 920 and the substrate S. Optical units 960 may be configured to divert the laser beam from between the mask 920 and the substrate S towards the deposition source 940. Before reaching deposition source 940, the laser beam L may be converted by one or more optical elements 965 to spread the laser beam L over a surface of deposition source 940 to avoid hot spots. Alternatively or additionally, a heat resistant absorber may be disposed on the deposition source 940 to absorb some or all of the laser beams L. In this manner, by focusing and directing some or all of the laser beams L to deposition source 940 may lower the cost of heating the deposition material in storage 942. For example, the laser beams L may preheat the storage 941 prior to the deposition process.

According to one or more exemplary embodiments, by using a deposition apparatus and a method of manufacturing an OLED display apparatus using the same, an error in a deposition pattern on a substrate may be reduced by arranging a laser beam to correspond to a deposition pattern unit in a mask. In this manner, precision of deposition may be enhanced and process efficiencies may be achieved. Additionally, by using a deposition apparatus and a method of manufacturing an OLED display apparatus using the same, an optical unit whose height may be adjusted may be used, and, thus, process efficiencies may be enhanced. It is noted, however, that the scope of exemplary embodiments are not limited to such effects.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A deposition apparatus comprising:
- a chamber;
- a stage supported in the chamber;
- a mask supported in the chamber via the stage, the mask comprising:
  - a mass forming a body; and
  - a plurality of openings forming a deposition pattern in the body;
- a chuck configured to support a substrate in the chamber, the chuck being configured to position the substrate to overlap the deposition pattern;
- a deposition source disposed in the chamber, the deposition source being configured to provide deposition material toward the substrate;
- a laser generator configured to generate a laser beam; and
- at least one optical component configured to guide the laser beam between the mask and the substrate to mask a portion of the substrate from deposition material via the laser beam.

2. The deposition apparatus of claim 1, wherein:
- the plurality of openings are configured to allow a portion of deposition material to propagate therethrough; and
- the at least one optical component is configured to guide the laser beam between the plurality of openings to mask the portion of the substrate from the portion of deposition material.

3. The deposition apparatus of claim 1, wherein:
- the at least one optical component is one of a plurality of optical components configured to guide the laser beam; and
- the plurality of optical components are disposed facing each other at opposing portions of the stage.

4. The deposition apparatus of claim 1, wherein the at least one optical component is configured to guide the laser beam parallel to a direction in which the chuck is configured to move the substrate.

5. The deposition apparatus of claim 1, further comprising:
- a driver connected to the at least one optical component, the driver being configured to adjust a height of the at least one optical component,
- wherein the at least one optical component comprises a mirror.

6. The deposition apparatus of claim 5, wherein:
- the stage comprises a groove;
- the driver is mounted in the groove; and
- the driver is further configured to selectively dispose the mirror in the groove.

7. The deposition apparatus of claim 5, wherein:
- the driver is disposed in the chamber; and
- the driver is configured to move the mirror toward and away from the stage.

8. The deposition apparatus of claim 1, further comprising:

an inspection sensor mounted inside the chamber, the inspection sensor being configured to detect movement of the substrate.

9. The deposition apparatus of claim 8, wherein:

the inspection sensor is configured to:

generate first output in response to detection of a first condition comprising entrance of the substrate in an area corresponding to the mask; and generate second output in response to detection of a second condition comprising departure of the substrate from the area; and the laser generator is configured to:

receive a signal corresponding to the first output or the second output;

initiate generation of the laser beam in response to the signal corresponding to the first output; and terminate generation of the laser beam in response to the signal corresponding to the second output.

10. The deposition apparatus of claim 1, wherein the laser generator comprises:

a laser source;

a multi-beam generator configured affect a pattern of the laser beam;

at least one lens configured to affect an arrangement of the pattern of the laser beam; and a first reflector configured to change a path of the arranged pattern.

11. The deposition apparatus of claim 10, wherein the multi-beam generator is configured to convert the laser beam into a plurality of laser beams.

12. The deposition apparatus of claim 11, wherein the at least one lens is configured to:

configure a size of the pattern of the plurality of laser beams; and/or cause the plurality of laser beams to be parallel with each other.

13. The deposition apparatus of claim 1, further comprising:

a laser absorber configured to absorb the laser beam after having passed between the mask and the substrate.

14. The deposition apparatus of claim 13, wherein the laser absorber comprises:

a second reflector configured to change a path of the laser beam; and a housing comprising:

an absorbent configured to absorb the laser beam directed via the second reflector; and a cooler configured to cool the housing.

15. The deposition apparatus of claim 1, wherein:

the mask is one of a plurality of masks disposed on the stage and spaced apart from one another; and the deposition source is one of a plurality of deposition sources arranged in correspondence with the plurality of the masks.

16. The deposition apparatus of claim 1, further comprising:

a frame supported in the chamber via the stage, wherein the mask is fixed to the frame in a tensioned state.

17. A method of manufacturing an organic light-emitting diode (OLED) display utilizing the apparatus of claim 1, the method comprising:

causing, at least in part, the substrate to be positioned over the mask in the chamber via the chuck configured to translate in the chamber;

causing, at least in part, laser light to propagate between the mask and the substrate; and causing, at least in part, the deposition material to be provided from the deposition source disposed in the chamber, wherein the deposition material passes through the mask and is deposited on the substrate according to the deposition pattern and a pattern of the laser light.

18. The method of claim 17, further comprising:

causing, at least in part, the laser light to be absorbed after having propagated between the mask and the substrate.

19. The method of claim 17, further comprising:

causing, at least in part, a first position of the substrate to be detected, the first position corresponding to the substrate entering an area corresponding to the mask, wherein the laser light is caused to propagate between the mask and the substrate in response to the detection of the first position;

causing, at least in part, a second position of the substrate to be detected, the second position corresponding to the substrate exiting the area corresponding to the mask; and causing, at least in part, the laser light to stop propagating between the mask and the substrate in response to the detection of the second position.

20. The method of claim 17, wherein:

the plurality of openings comprises a first opening spaced apart from a second opening;

the pattern of laser light comprises:

a first laser beam disposed between the first opening and the second opening;

a second laser beam, the first opening being disposed between the second laser beam and the first laser beam; and a third laser beam, the second opening being disposed between the third laser beam and the first laser beam.

* * * * *